(12) United States Patent
Gomm et al.

(10) Patent No.: US 7,068,085 B2
(45) Date of Patent: *Jun. 27, 2006

(54) METHOD AND APPARATUS FOR CHARACTERIZING A DELAY LOCKED LOOP

(75) Inventors: Tyler J. Gomm, Meridian, ID (US); Michael B. Roth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/880,394

(22) Filed: Jun. 29, 2004

(65) Prior Publication Data

US 2004/0232962 A1 Nov. 25, 2004

Related U.S. Application Data

(63) Continuation of application No. 10/095,149, filed on Mar. 11, 2002, now Pat. No. 6,774,687.

(51) Int. Cl.
*H03L 7/06* (2006.01)

(52) U.S. Cl. ..................... 327/158; 327/161
(58) Field of Classification Search ............... 327/141, 327/142, 149, 152, 153, 158, 161; 365/93, 365/189.12, 201, 233
See application file for complete search history.

(56) References Cited

U.S. PATENT DOCUMENTS

| | | | | |
|---|---|---|---|---|
| 5,717,353 A | * | 2/1998 | Fujimoto | 327/276 |
| 5,946,244 A | * | 8/1999 | Manning | 365/194 |
| 6,002,281 A | * | 12/1999 | Jones et al. | 327/161 |
| 6,085,345 A | * | 7/2000 | Taylor | 714/731 |
| 6,108,793 A | * | 8/2000 | Fujii et al. | 713/400 |
| 6,184,753 B1 | * | 2/2001 | Ishimi et al. | 331/34 |
| 6,385,129 B1 | * | 5/2002 | Silvestri | 365/233 |
| 6,414,903 B1 | * | 7/2002 | Keeth et al. | 365/233 |
| 6,421,801 B1 | * | 7/2002 | Maddux et al. | 714/744 |
| 6,452,849 B1 | * | 9/2002 | Iwamoto | 365/201 |
| 6,476,594 B1 | * | 11/2002 | Roisen | 324/76.54 |

* cited by examiner

*Primary Examiner*—Timothy P. Callahan
*Assistant Examiner*—Cassandra Cox
(74) *Attorney, Agent, or Firm*—Williams,Morgan & Amerson,P.C.

(57) ABSTRACT

A delay locked loop includes a forward path, a feedback path, a phase detector, logic, and a dither circuit. The forward path includes a delay line configured to receive an input clock signal and delay the input clock signal by a time interval to generate an output clock signal. The feedback path is configured to provide a feedback clock signal based on the output clock signal. The phase detector is configured to compare the input clock signal and the feedback clock signal and generate a shift signal if the output clock signal is not in phase with the input clock signal. The logic is coupled to the delay line and configured to receive the shift signal and control the time interval based on the shift signal. The dither circuit is coupled to the delay line and configured to introduce a delay responsive to an assertion of a test mode enable signal.

18 Claims, 8 Drawing Sheets

METHOD AND APPARATUS FOR CHARACTERIZING A DELAY LOCKED LOOP

CROSS-REFERENCE TO RELATED APPLICATION

This is a continuation of application Ser. No. 10/095,149 filed Mar. 11, 2002 now U.S. Pat. No. 6,774,687.

BACKGROUND OF THE INVENTION

1. Field of the Invention

This invention relates generally to the synchronization of periodic signals, such as clock signals. More particularly, the invention relates to a method and apparatus for characterizing a delay locked loop.

2. Description of the Related Art

Many high speed electronic systems possess critical timing requirements that dictate the need to generate a periodic clock waveform possessing a precise timing relationship with respect to some reference signal. The improved performance of computing integrated circuits and the growing trend to include several computing devices on the same board present a challenge with respect to synchronizing the time frames of all the components.

While the operation of all components in the system should be highly synchronized, i.e., the maximum skew in time between the significant edges of the internally generated clocks of all the components should be minimized, it is not enough to feed the reference clock of the system to all the components. This is because different chips may have different manufacturing parameters, which, when taken together with additional factors such as ambient temperature, voltage, and processing variations, may lead to large differences in the phases of the respective chip generated clocks.

Conventionally, synchronization is achieved by using digital delay locked loop (DDLL) circuits to detect the phase difference between clock signals of the same frequency and produce a digital signal related to the phase difference. By feeding back the phase difference-related signal to control a delay line, the timing of one clock signal is advanced or delayed until its rising edge is coincident with the rising edge of a second clock signal.

Figure 1:
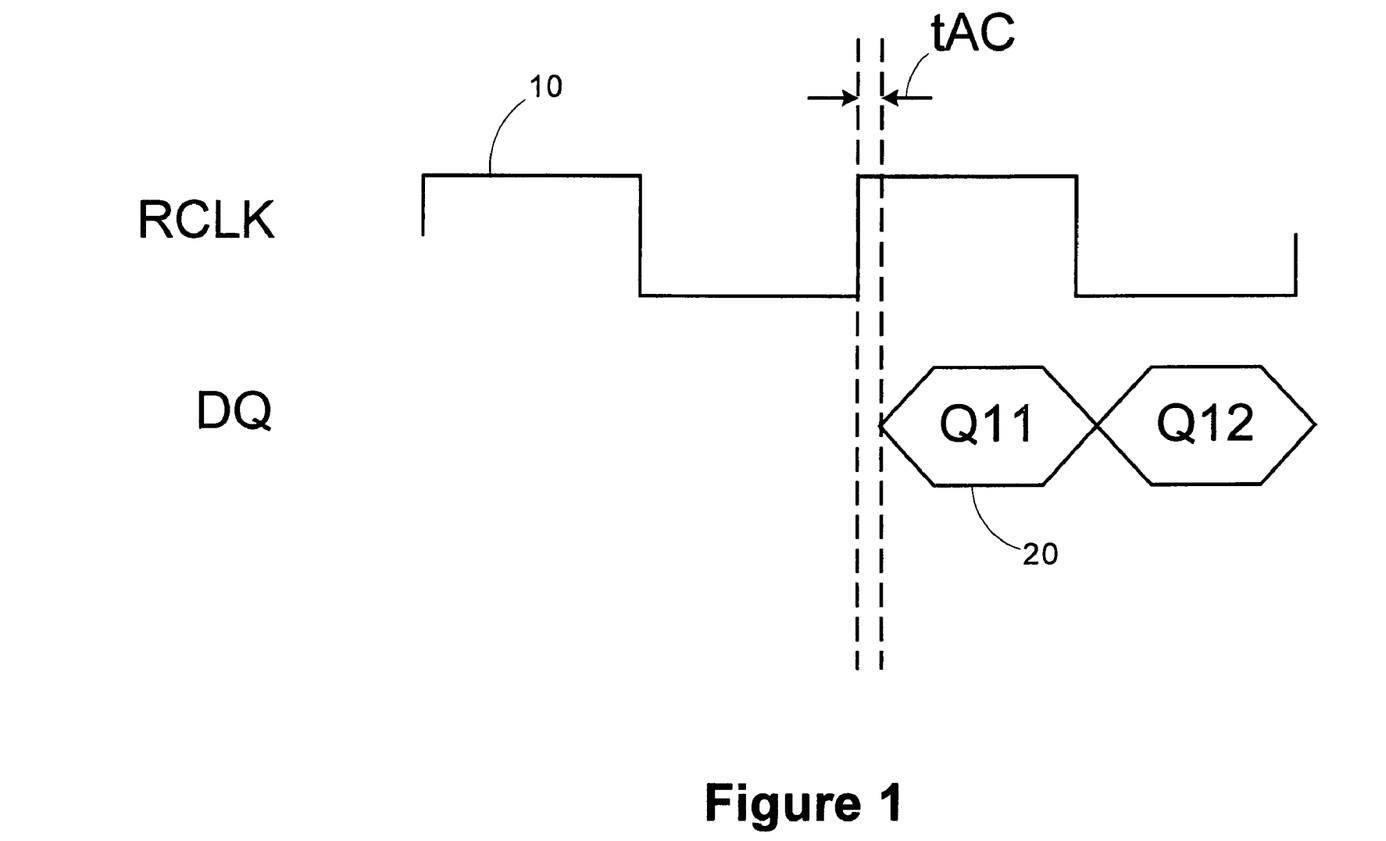
FIG. 1 is a timing diagram illustrating the alignment between a reference clock signal and transitions of an aligned data signal to illustrate tAC tolerances.

The performance of DDLL circuits is typically tested by measuring the alignment between the data output by the device and the external reference clock to which the data is to be synchronized. FIG. 1A is a timing diagram showing a reference clock signal 10 and a data output signal 20. If the performance of the DDLL were ideal, the data signal would transition exactly in synch with the edge of the clock signal. However, because the DDLL is implemented using digital circuitry, it must make discrete delay adjustments to attempt to synchronize the data transitions with the reference clock signal. Because of this granularity, there is typically some degree of skew between the reference clock signal and the transitions of the data signal. The skew present between transitions of the reference clock and data transitions is typically referred to as an access time, tAC. The tAC may be positive (i.e., the data signal transitions after the transition of the reference clock signal), as shown in FIG. 1, or negative (i.e., the data signal transitions before the transition of the reference clock signal).

Typically, the specifications for digital devices, such as synchronous dynamic random access memories (SDRAM), specify a tolerance value for maximum and minimum tAC values, such as ±750 picoseconds. To test the performance of the completed device, a back-end test is performed to characterize the response of the DDLL circuit by measuring tAC. To measure tAC the device is typically subjected to a performance test. The skew between the reference clock signal and the data transitions are measured in a test unit to establish a tAC(min) and a tAC(max) for the device.

The tAC characterization test may be used for fault detection and/or tuning. For a fault detection screening, a device that fails the criteria for tAC may be scrapped. If the device is unable to keep the data transitions within the predetermined tolerances, other devices may receive errant data (i.e., data that is still transitioning when it is expected to be stable).

Even if a particular test results in a tAC failure, it may still be possible to tune the DDLL to place the tAC within tolerances. Indeed, even for devices that pass the tAC it is common to tune the DDLL to improve its performance. Small shifts in the delay imposed by the DDLL circuit may be implemented by changing the state of various fuses and anti-fuses in the circuit. A prerequisite to accurate tuning is the presence of an accurate tAC characterization.

There are limitations to the accuracy of the tAC characterization performed using the back-end test methodology described above. Due to the number of devices being tested, it is necessary to perform the testing quickly. Typically, the entire test may be performed with the device operating at a near constant temperature and voltage. Variations in the process, voltage, and temperature (i.e., PVT variations) can cause changes in the performance of the DDLL, because they affect the delay imposed by the delay line. For example, increases in temperature may increase the delay imposed by the delay line.

Typically, a delay line is comprised of an array of serially cascaded delay elements that are selectively engaged by a control circuit to synchronize the data transitions with the reference clock. During operation of the DDLL circuit, a phase detector monitors phase errors between the reference clock signal and the internal clock signal used to control the data transitions and adds or removes the discrete delay elements to reduce the phase errors measured by the phase detector. The control is thus granular in nature due to the discrete nature of the stages in the delay line.

Figure 2A:
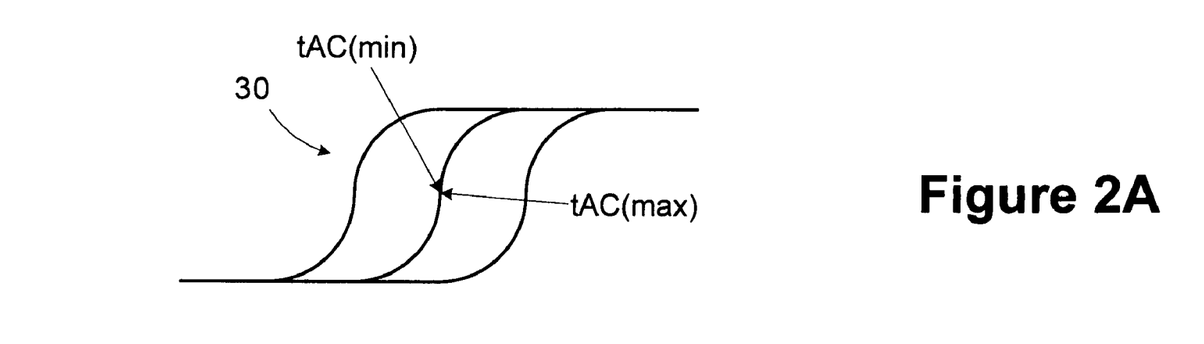
FIGS. 2A through 2C illustrate different tAC characterizations that may be observed for a digital device.
Figure 2B:
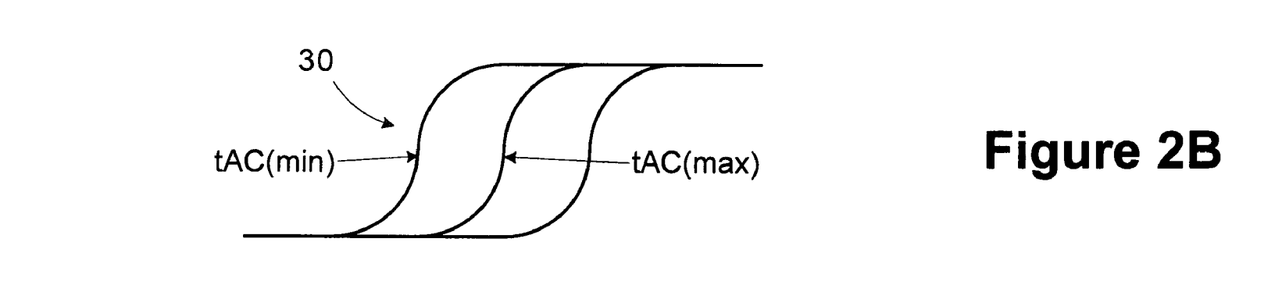
Figure 2C:
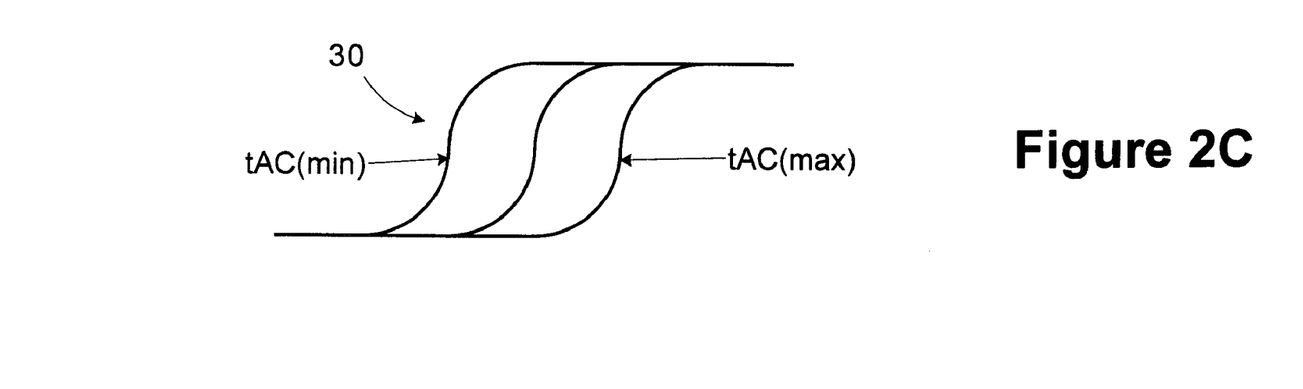

FIGS. 2A through 2C are diagrams illustrating operating bands 30 of a DDLL circuit. The bands 30 correspond to discrete stages of the delay line in the DDLL circuit. The DDLL represented by the diagrams of FIGS. 2A through 2C is designed to operate with three possible bands 30. Note that ideal bands 30 are illustrated without any additional noise. Also note that if the hysteresis of the DDLL (i.e., dead band) is larger, even more bands 30 may exist.

During the tAC characterization test, the tester only measures the bands 30 in which the device is operating. Because parameters such as voltage and temperature are not varied during the test, it is possible that the tester does not accurately characterize the worst case tAC. Such PVT variation could cause the DDLL to actually shift to different bands 30, which would broaden out the actual tAC. A worst case tAC may be determined in the lab by probing a signal pin, varying PVT conditions, such as temperature, and monitoring the device over time using an oscilloscope. This test reveals the full banding plus noise characteristics of the DDLL. Such a characterization in the lab is time consuming and not practical for back-end testing of large numbers of devices.

Exemplary characterization errors are illustrated in FIGS. 2A through 2C. If the PVT conditions were varied in a lab setting, operation in all three bands 30 could be observed and the proper values for tAC(min) and tAC(max) could be determined. However, under the conditions of the back-end test, all three bands 30 may not be observed. FIG. 2A represents the case where the back-end characterization test observes the DDLL operating in only one band 30. The tester thus characterizes tAC(min) and tAC(max) as indicated. FIG. 2B represents the case where operation is observed in two bands 30, resulting in a different characterization, albeit still inaccurate. FIG. 2C represents the case where operation is observed in all three bands, and an accurate characterization can be made.

If the conditions represented by FIG. 2A or 2C are observed during the back-end test, the tAC characterization produced by the tester will be incorrect. This inaccurate characterization may lead to passing devices that are actually not within design tolerances. Characterization errors may also result in incorrect decisions regarding which DLL trim fuses should be blown to move the entire tAC window and tune the DDLL. If the actual tAC is different than the back-end characterization, the window may be shifted too far or even in the wrong direction. Such an errant tuning could cause a device that was initially within design tolerances to be moved to a region where it is actually outside of these tolerances.

The present invention is directed to overcoming, or at least reducing the effects of, one or more of the problems set forth above.

SUMMARY OF THE INVENTION

One aspect of the present invention is seen in a delay locked loop including a forward path, a feedback path, a phase detector, logic, and a dither circuit. The forward path includes a delay line configured to receive an input clock signal and delay the input clock signal by a time interval to generate an output clock signal. The feedback path is configured to provide a feedback clock signal based on the output clock signal. The phase detector is configured to compare the input clock signal and the feedback clock signal and generate a shift signal if the output clock signal is not in phase with the input clock signal. The logic is coupled to the delay line and configured to receive the shift signal and control the time interval based on the shift signal. The dither circuit is coupled to the delay line and configured to introduce a delay responsive to an assertion of a test mode enable signal.

Another aspect of the present invention is seen in a method for synchronizing clock signals. The method includes receiving an input clock signal. The input clock signal is delayed by a time interval to generate an output clock signal. A feedback clock signal based on the output signal is received. A phase alignment error between the input clock signal and the feedback clock signal is detected. The time interval is controlled to synchronize the input clock signal with the feedback clock signal. A delay in one of the input clock signal and the feedback clock signal is introduced responsive to a test mode enable signal.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 3:
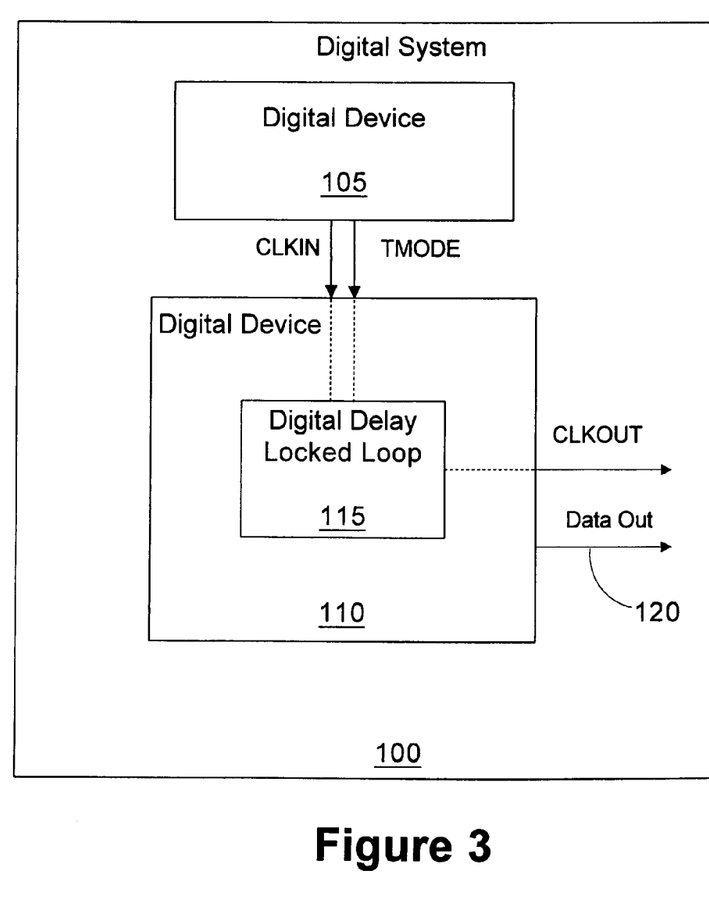
FIG. 3 is a simplified block diagram of a digital system having a digital delay locked loop circuit in accordance with the present invention.

Referring to FIG. 3, a simplified block diagram of a digital system 100 is provided. The digital system 100 includes a first digital device 105 coupled to a second digital device 110. The first digital device 105 provides a reference clock signal (CLKIN) to the second digital device 110. The second digital device 110 uses the CLKIN signal to synchronize its internal clocks using a delay locked loop (DDLL) 115 and generate an output clock signal (CLKOUT). As an illustrative example, the first digital device 105 may be a memory controller in a computer system, and the second digital device 110 may be a memory device that synchronizes its output data on a data line 120 with the CLKOUT signal. Although the invention is described as it may be applied to a digital DLL circuit, it is not so limited and may be applied to other implementations, including analog DLL circuits.

Figure 4:
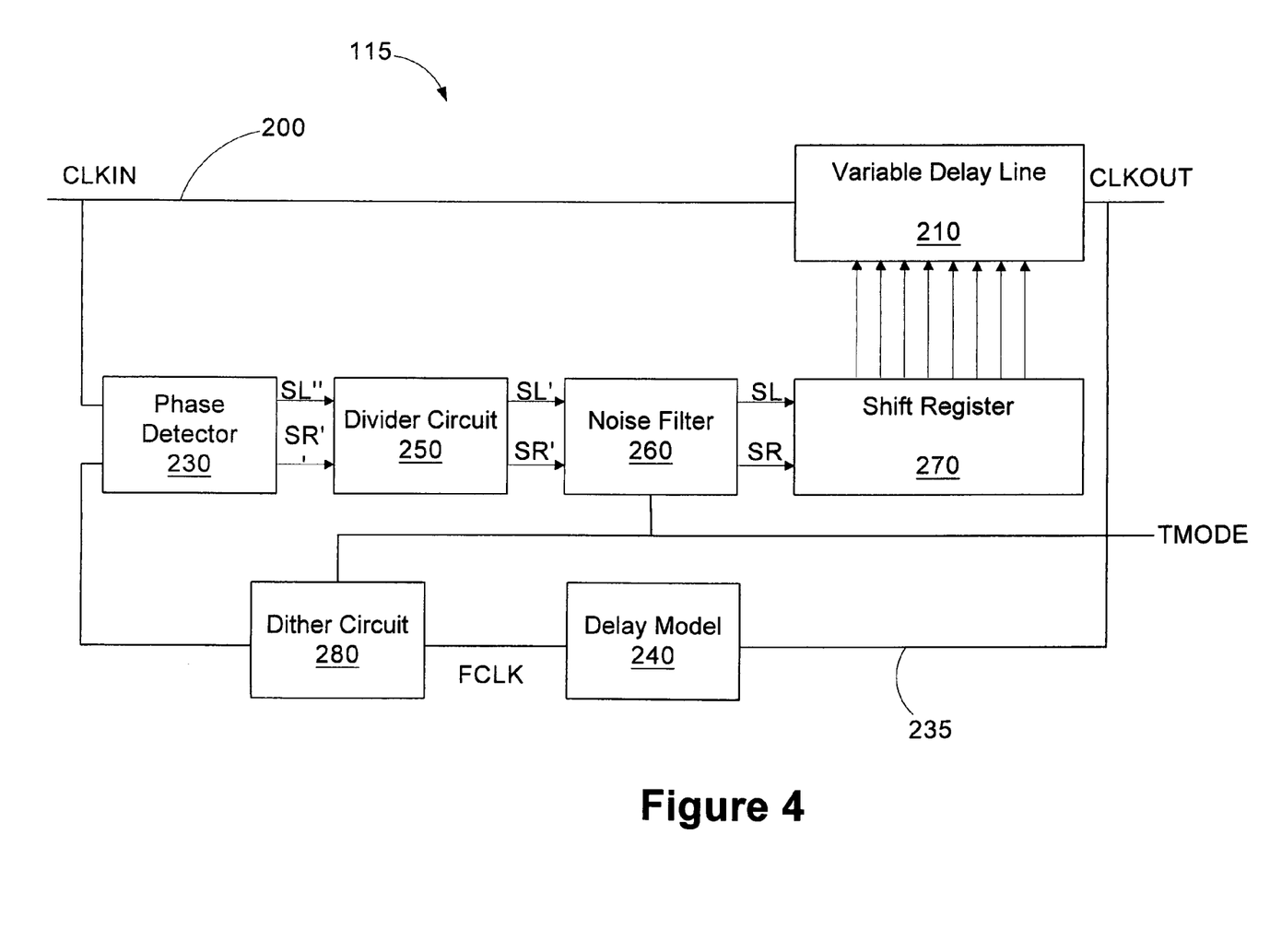
FIG. 4 is a simplified block diagram of the digital delay locked loop circuit of FIG. 3.

Turning now to FIG. 4, a simplified block diagram of the DDLL 115 is illustrated. The DDLL 115 includes a forward path 200, on which the input clock signal (CLKIN) is received. The forward path 200 includes a variable delay line 210. The variable delay line 210 adds a variable delay to the CLKIN signal to generate the output clock signal (CLKOUT) on the forward path 200.

A phase detector 230 receives the CLKIN signal and a feedback clock signal (FCLK) through a feedback path 235. The FCLK signal corresponds to the actual output clock signal of the device 110 after the clock signal passes through its internal circuitry. The FCLK signal is used as a feedback signal for identifying phase differences between the CLKIN signal and the actual output clock signal (not shown) of the digital device 110. To generate the FCLK signal, the CLKOUT signal is passed through a delay model 240 that uses a variety of logic components to approximate the delay introduced in the CLKOUT signal by the circuitry of the digital device 110. The FCLK signal thus approximates the actual output clock signal of the digital device 110. In an alternative embodiment, the actual output clock signal (not shown) may be used to generate feedback information for the phase detector 230.

The phase detector 230 provides a binary output based on the relative phase difference between the CLKIN and FCLK signals. In the illustrated embodiment, the phase detector 230 provides two output signals, SL", SR" that indicate the relationship between the CLKIN and FCLK signals. The SL" signal (i.e., more delay) is asserted if the FCLK signal leads the CLKIN signal. The SR" signal (i.e., less delay) is asserted if the FCLK signal lags the CLKIN signal. Both of the SL" and SR" signals are deasserted if the FCLK and CLKIN signals are in phase.

The phase detector 230 is connected to a divider circuit 250 configured to divide the frequency of the phase detector 230 output signals. In the illustrated embodiment, more than one clock cycle is required for a change in the delay quantity to propagate through the variable delay line 210 and be evident in the CLKOUT signal. If adjustments to the amount of delay were to be attempted mid-cycle (i.e., before the variable delay line 210 has stabilized), the DDLL 115 would be less stable. Accordingly, the divider circuit 250 provides a shift right signal (SR') and a shift left signal (SL') based on the outputs of the phase detector 230 on every other cycle. It is contemplated that the division factor used in the divider circuit 250 may vary, depending on the latency of the variable delay line 210. For example, the divider circuit 250 may only provide an output every third or fourth cycle. Also, if the response of the variable delay line 210 is sufficiently fast, the divider circuit 250 may be omitted entirely.

The divider circuit 250 is coupled to a noise filter 260 for reducing the effects of noise (i.e., typically high frequency noise) present in the CLKIN signal. The noise filter 260 receives the SL' and SR' signals from the divider circuit 250 and generates noise-compensated shift signals, SL and SR. The particular construct of the noise filter 260 depends on the particular implementation and the type of noise expected. In one embodiment, the noise filter 260 may be a majority filter for reducing jitter in the output of the phase detector 230. For example, high frequency noise in the CLKIN signal may cause an apparent phase shift between the CLKIN and FCLK signals. The transient nature of the noise may result in the phase detector 230 detecting a shift in one direction during one clock cycle followed by a shift in the other direction during a subsequent clock cycle. The noise filter 260 (i.e., in a majority filter implementation) waits until the output of the phase detector 260 remains at a constant shift signal condition for a predetermined number of clock cycles. In one exemplary embodiment, the noise filter 260 may be an n-stage delay that outputs the SL signal or the SR signal only if its corresponding SL' or SR' signal persists for a predetermined number of cycles. In the illustrated embodiment, the predetermined number of cycles is two, but it is contemplated that a greater number of cycles may be used, depending on the specific application and the nature of the noise in the CLKIN signal.

The length of the delay provided by the variable delay line 210 is controlled by a shift register 270. The shift register 270 receives the SL and SR signals from the noise filter 260 and controls the amount of delay generated by the variable delay line 210 accordingly.

The DDLL 115 also includes a dither circuit 280 for simulating process, voltage, and temperature (PVT) variations. The dither circuit 280 allows a variable amount of delay to be added to the feedback path to simulate changes in the delay provided by the variable delay line 210, as would be observed during a testing evolution under varying PVT conditions. The dither circuit 280 may be enabled by a test mode (TMODE) signal during a back-end DDLL characterization test to more accurately determine tAC(min) and tAC(max) for the digital device 110. For example the first digital device 105 shown in FIG. 1 may be an integrated circuit tester configured to supply the TMODE signal and perform a test on the second digital device 110.

During normal operation of the first digital device 110, the TMODE signal is held in a deasserted state. During the back-end tAC characterization, the noise filter 260 may also be bypassed responsive to the TMODE signal. Bypassing the noise filter 260 allows better determination of the worst case. If the noise filter 260 were left enabled, it may reduce the effects of the PVT variation simulated by the dither circuit 280.

In the illustrated embodiment, the dither circuit 280 provides a periodic delay pattern spread over a predetermined number of clock cycles (e.g., 50–100). The number of clock cycles in the period, as well as the amount of delay introduced, is implementation specific. During the design of the second digital device 110, these parameters may be specified, taking into account factors such as the width of the bands in the variable delay line 210, the responsiveness of the DDLL 115, and the expected PVT environment.

Figure 5:
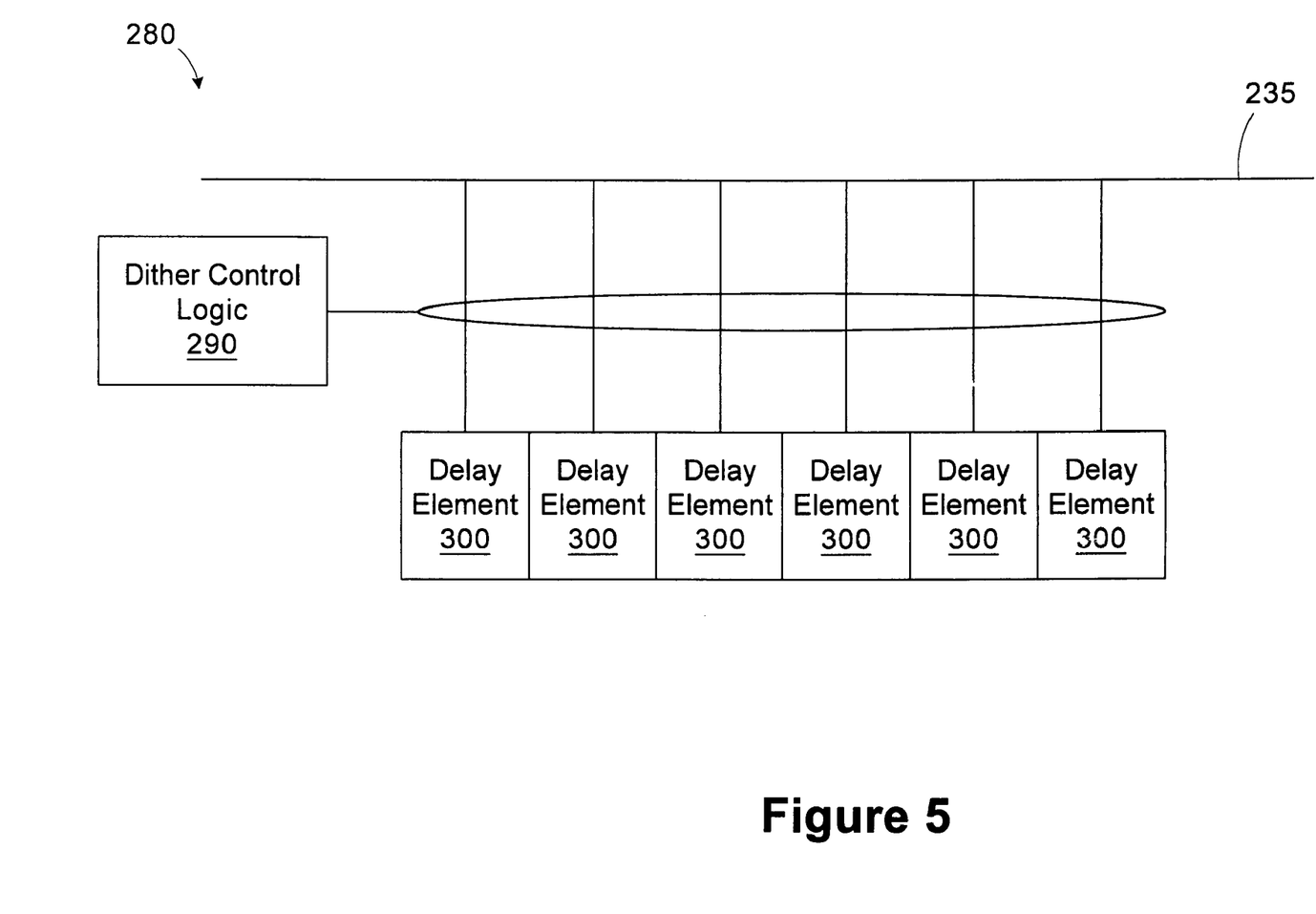
FIG. 5 is a simplified block diagram of a dither circuit that may be used in the digital delay locked loop circuit of FIG. 4.

Referring now to FIG. 5, a simplified block diagram of an exemplary implementation of the dither circuit 280 is provided. The dither circuit 280 includes dither control logic 290 and a plurality of delay elements 300. The dither control logic 290 periodically switches the delay elements 300 into the feedback path 235 to simulate PVT variation.

Figure 6:
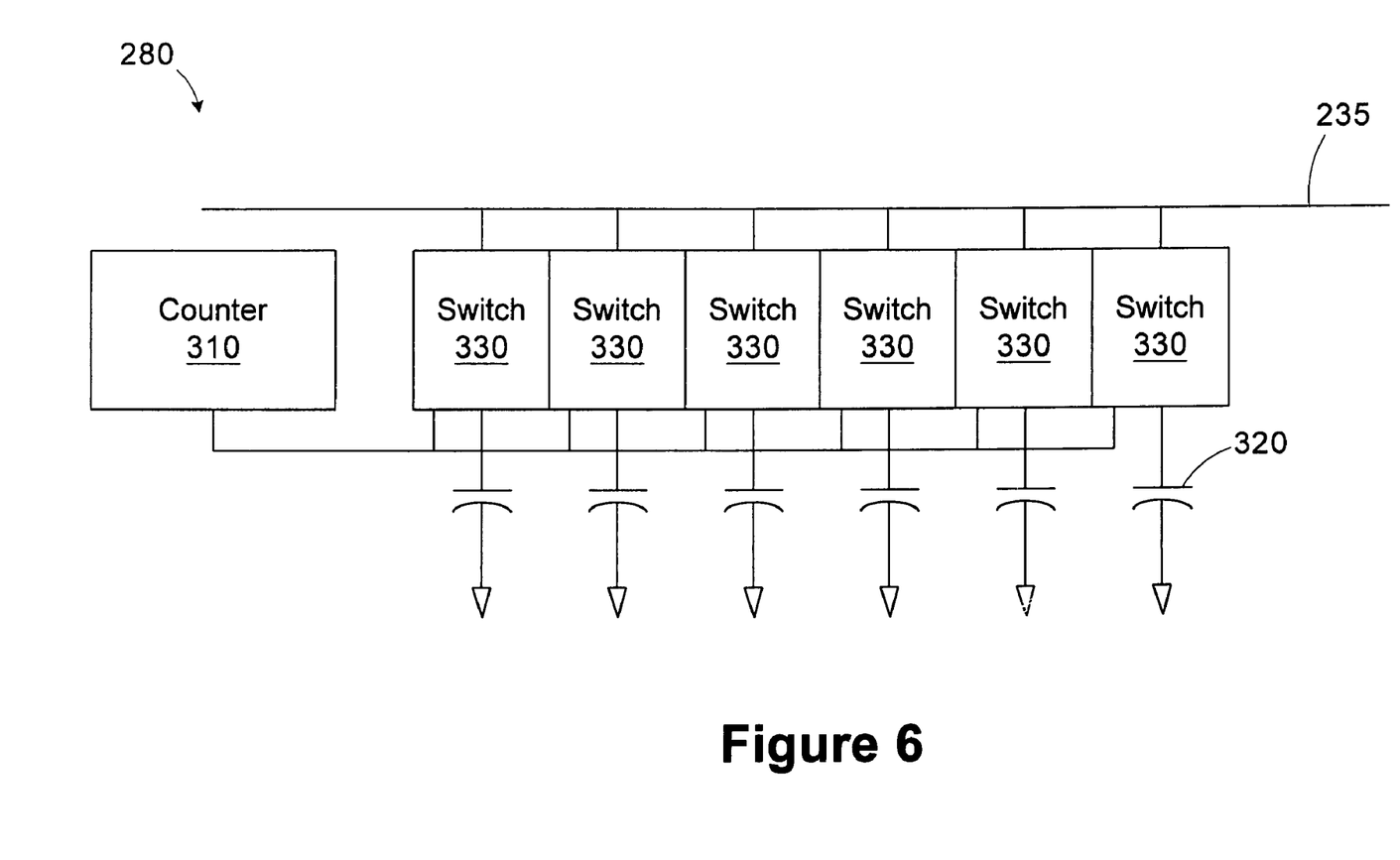
FIG. 6 is a simplified block diagram illustrating an exemplary embodiment of the dither circuit of FIG. 5.
Figure 7A:
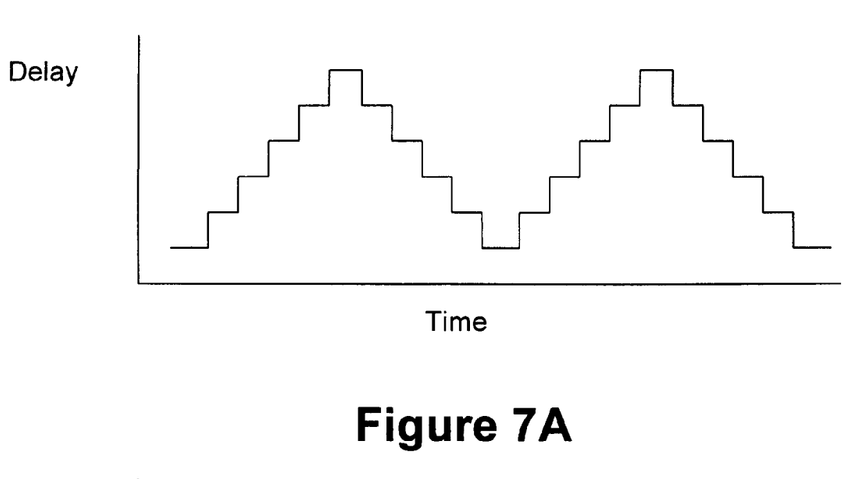
FIGS. 7A and 7B illustrate diagrams of exemplary delay waveforms that may be implemented by the dither circuit of FIG. 5.
Figure 7B:
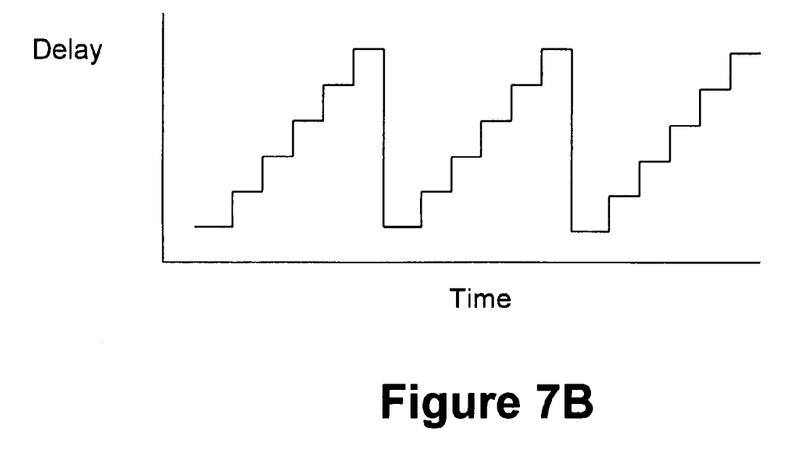

Various possible circuit combinations may be used to implement the dither control logic 290 and the delay elements 300. An exemplary circuit configuration is shown in FIG. 6. In the embodiment of FIG. 6, the dither control logic 290 comprises a counter 310, and the delay elements 300 are weighted capacitors 320 coupled to the feedback path 235 by switches 330 (e.g., transistors). The weighted capacitors 320 have capacitance values corresponding to the weights of the outputs of the counter 310. For example, if the weighted capacitor 320 associated with bit 0 of the counter 310 has a capacitance value of X the weighted capacitor 320 associated with bit 1 of the counter 310 would have a capacitance of 2X. The subsequent weighted capacitors 320 would have capacitances of 4X (bit 2), 8X (bit 3), etc., up to the most significant bit, k, of the counter 310 (i.e., $2^k \times X$). The weighted capacitors 320 may be individual capacitors having different sizes or, alternatively, they may be implemented using different size banks of capacitors having the same capacitance value. Hence, as the counter 310 increments, the total capacitance of the weighted capacitors 320 increases linearly. In the illustrated embodiment, the counter 310 is an up/down counter, so that the delay imposed by the weighted capacitors 320 is seen as a periodic triangular delay waveform, as illustrated in FIG. 7A. Alternatively, a wrap-around counter may be used, resulting in a periodic sawtooth delay waveform, as illustrated in FIG. 7B.

A linear increase may also be realized by providing $2^k$ individual capacitors (not shown) having the same capacitance for the delay elements 300 and appropriate logic gates (not shown) to convert the binary outputs of the counter to k individual enable signals for sequentially enabling the delay elements 300. In yet another embodiment, a shift register (not shown) may be used in lieu of the counter 310 to generate the k enable signals for $2^k$ individual capacitors (not shown) having the same capacitance. Other circuit implementations, including digital implementations, may also be used to accomplish the variable delay, as will be appreciated by those of ordinary skill in the art.

The frequency at which the counter 310 is incremented may also vary. For example, if the counter 310 is a 6-stage counter (i.e., 36 steps), and the delay elements 300 are to be cycled in over approximately 100 clock cycles, the frequency of the clock signal applied to the counter could be divided such that it is ⅓ that of the CLKIN signal. Hence, the period of the dither cycle would be 36*3=108 clock cycles.

Figure 8:
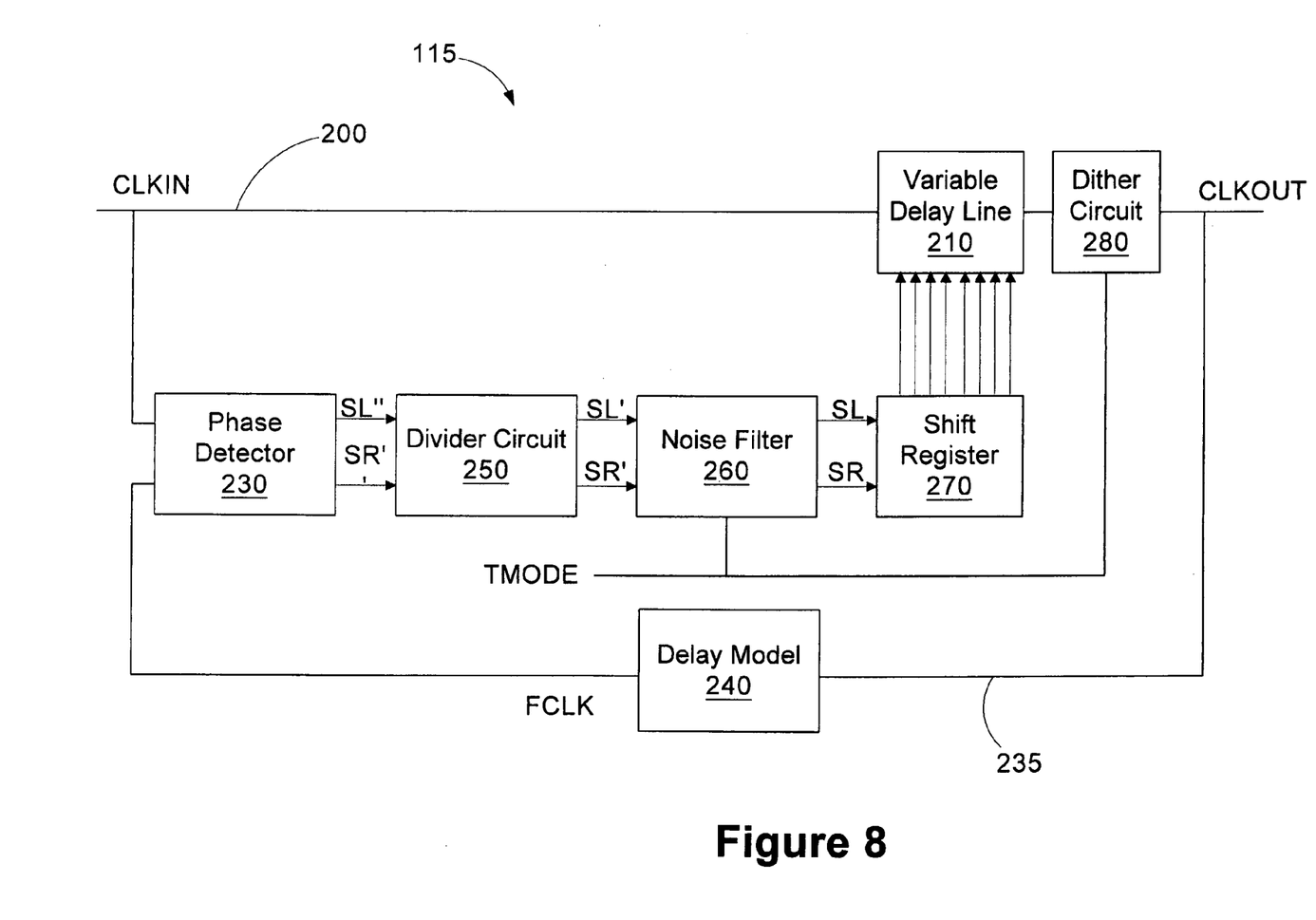
FIG. 8 is a simplified block diagram of an alternative embodiment of the digital delay locked loop circuit of FIG. 3.

Turning now to FIG. 8, a simplified block diagram of an alternative embodiment of the DDLL 115 is provided. In the embodiment, of FIG. 8, the dither circuit 280 is in the forward path 200 instead of the feedback path 235, and thus, the delay introduced by the dither circuit 280 is also seen in the CLKOUT signal. The dither circuit will 280 change delay until the phase detector 230 is tripped and adjusts the variable delay line 210 to bring the system back to a locked state. To accommodate this situation, the variable delay line 210 is provided with capacity to compensate for the additional delay provided by the dither circuit 280.

The variable delay imposed by the dither circuit 280 (in the embodiments of FIGS. 4 and 8) allows the worst case tAC characteristics to be determined, thus resulting in a more accurate characterization, as compared to the characterization possible using a conventional back-end test. A more accurate characterization allows more effective tuning of the DDLL 115. Based on the tAC characteristics, trim fuses (not shown) in the DDLL 115 may be blown to shift the entire tAC window to improve its response. A more accurate tAC characterization also reduces fault detection errors, as the likelihood of passing faulty devices is decreased.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of operating a memory device, the method comprising:
   receiving an input clock signal;
   outputting data from the memory device synchronized with an output clock signal;
   receiving a test mode enable signal;
   delaying the input clock signal by a time interval to generate the output clock signal;
   providing a feedback clock signal based on the output clock signal;
   comparing the input clock signal and the feedback clock signal and generate a shift signal if the feedback clock signal is not in phase with the input clock signal;
   receiving the shift signal and control the time interval based on the shift signal; and
   introducing a delay in one of the input clock signal and the feedback clock signal responsive to an assertion of a test mode enable signal.

2. The method of claim 1, wherein introducing the delay further comprises introducing a variable delay.

3. The method of claim 2, wherein introducing the variable delay further comprises introducing a periodic variable delay.

4. The method of claim 3, wherein introducing the periodic variable delay further comprises introducing the periodic variable delay having a triangular waveform.

5. The method of claim 3, wherein introducing the periodic variable delay further comprises introducing the periodic variable delay having a sawtooth waveform.

6. The method of claim 1, wherein introducing the delay further comprises:
   providing a plurality of delay elements coupled to one of a feedback path configured to provide the feedback clock signal and a forward path configured to receive the input clock signal; and
   enabling selected delay elements to generate the delay.

7. The method of claim 6, wherein enabling the selected delay elements further comprises enabling selected capacitors.

8. The method of claim 7, wherein enabling the selected capacitors further comprises enabling the selected capacitors using a counter having a plurality of stages.

9. The method of claim 8, wherein providing the capacitors further comprises providing a plurality of weighted capacitors, each weighted capacitor having a weighted capacitance based on the stage of the counter by which it is enabled.

10. The method of claim 8, wherein providing the capacitors further comprises providing banks of capacitors, each bank having an associated weighted capacitance based on the stage of the counter by which it is enabled.

11. A method for controlling an access time parameter, tAC, in a memory device, the method comprising:
    providing a delay locked loop for synchronizing an input clock signal with a feedback clock signal;
    receiving a test mode enable signal; and
    introducing a delay in one of the input clock signal and the feedback clock signal to simulate an environmental variation in the delay locked loop responsive to the test mode enable signal.

12. The method of claim 11, further comprising measuring a skew between transitions of a data signal and the input clock signal.

13. The method of claim 12, further comprising determining the access time parameter, tAC, based on the measured skew.

14. The method of claim 13, further comprising determining a minimum tAC and a maximum tAC based on the measured skew.

15. The method of claim 13, further comprising identifying a fault condition responsive to the determined tAC being greater that a design threshold.

16. A memory device, comprising:
    a delay locked loop having a forward path for receiving an input clock signal and a feedback path for synchronizing the input clock signal with a feedback clock signal; and
    a dither circuit coupled to one of the forward path and the feedback path and being configured to introduce a delay to simulate an environmental variation in the delay locked loop responsive to a test mode enable signal.

17. The memory device of claim 16, wherein the memory device is a dynamic random access memory.

18. The memory device of claim 17, wherein the dynamic random access memory is a static dynamic random access memory.

* * * * *